(12) United States Patent
Curello et al.

(10) Patent No.: US 7,335,959 B2
(45) Date of Patent: Feb. 26, 2008

(54) DEVICE WITH STEPPED SOURCE/DRAIN REGION PROFILE

(75) Inventors: Giuseppe Curello, Portland, OR (US); Bernhard Sell, Portland, OR (US); Sunit Tyagi, Portland, OR (US); Chris Auth, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 337 days.

(21) Appl. No.: 11/031,843

(22) Filed: Jan. 6, 2005

(65) Prior Publication Data
US 2006/0145273 A1 Jul. 6, 2006

(51) Int. Cl.
*H01L 29/76* (2006.01)
*H01L 29/94* (2006.01)

(52) U.S. Cl. .................. 257/408; 257/336; 438/300
(58) Field of Classification Search ........... 438/300; 257/336, 344, 408, 900, E21.135, E21.153
See application file for complete search history.

(56) References Cited

U.S. PATENT DOCUMENTS

| | | | |
|---|---|---|---|
| 5,508,539 A | 4/1996 | Gilbert et al. | |
| 6,121,100 A | 9/2000 | Andideh et al. | |
| 6,326,664 B1 | 12/2001 | Chau et al. | |
| 6,342,421 B1 | 1/2002 | Mitani et al. | |
| 6,368,926 B1 | 4/2002 | Wu | |
| 6,368,927 B1 * | 4/2002 | Lee | 438/300 |
| 6,391,692 B1 * | 5/2002 | Nakamura | 438/151 |
| 6,541,343 B1 * | 4/2003 | Murthy et al. | 438/299 |
| 6,599,803 B2 * | 7/2003 | Weon et al. | 438/300 |
| 6,621,131 B2 | 9/2003 | Murthy et al. | |
| 6,797,556 B2 * | 9/2004 | Murthy et al. | 438/231 |
| 2003/0104645 A1 * | 6/2003 | Weon et al. | 438/44 |
| 2004/0001943 A1 | 1/2004 | Bohr et al. | |
| 2004/0007724 A1 * | 1/2004 | Murthy et al. | 257/288 |
| 2004/0188760 A1 | 9/2004 | Skotnicki et al. | |
| 2004/0235236 A1 | 11/2004 | Cea et al. | |
| 2004/0262683 A1 | 12/2004 | Bohr et al. | |

FOREIGN PATENT DOCUMENTS

WO WO 2004/034458 A1 4/2004
WO WO 2004/095565 A1 11/2004

OTHER PUBLICATIONS

T. Ghani et al., "A 90nm High Volume Manufacturing Logic Technology Featuring Novel 45nm Gate Length Strained Silicon CMOS Transistors", 4 pages, 978-IEDM 03.
International Application No. PCT/US2006/000686, Notification of Tranmsittal of the Internaional Search Report and the WRitten Opinion of the International Searching Authority.

(Continued)

*Primary Examiner*—Fernando L. Toledo

(57) ABSTRACT

Embodiments of the invention provide a transistor with stepped source and drain regions. The stepped regions may provide significant strain in a channel region while minimizing current leakage. The stepped regions may be formed by forming two recesses in a substrate to result in a stepped recess, and forming the source/drain regions in the recesses.

24 Claims, 12 Drawing Sheets

OTHER PUBLICATIONS

Intel application P16000, Tyagi et al., "Transistor With Strain-Inducing Structure in Channel", filed Nov. 14, 2003, U.S. Appl. No. 10/714,139.

Intel application P19535, Bohr et al., "Stepped Tip Junction With Spacer Layer", filed May 17, 2004, U.S. Appl. No. 10/847,987.

Intel application P18251, Armstrong et al., "Enhancing Strained Device Performance by use of Multi Narrow Section Layout", filed Mar. 31, 2004, U.S. Appl. No. 10/815,911.

* cited by examiner

DEVICE WITH STEPPED SOURCE/DRAIN REGION PROFILE

BACKGROUND OF THE INVENTION

Integrated circuits are often manufactured in and on silicon and other semiconductor wafers. Such integrated circuits include literally millions of metal oxide semiconductor (MOS) field effect transistors. Such MOS transistors may include p-channel MOS (PMOS) transistors, and n-channel MOS (NMOS) transistors, depending on their dopant conductivity types.

Wafers may be obtained by drawing an ingot of silicon out of a liquid silicon bath. The ingot may be made of monocrystalline (single-crystal) silicon, and is subsequently sawed into individual wafers. A layer of silicon may be then deposited over each wafer. Because the wafer may be made of monocrystalline silicon, the deposition conditions can be controlled so that the layer of silicon deposits "epitaxially" over the wafer. "Epitaxy" refers to the manner in which the silicon layer deposits on the wafer—the layer of silicon has a lattice which has a structure which follows a structure of a lattice of the monocrystalline silicon of the wafer. The layer of silicon may be also substantially the same material as the monocrystalline silicon of the wafer, so that the lattice of the silicon layer also has substantially the same spacing as the spacing of the lattice of the monocrystalline silicon of the wafer.

A gate dielectric layer, a gate electrode, and spacers are subsequently formed on the layer of silicon. Ions are also implanted into the layer of silicon, which form source and drain regions on opposing sides of the gate electrode. A voltage can be applied over the source and drain regions. Current flows from the source region to the drain region through a channel below the gate dielectric layer when a voltage is applied to the gate electrode.

It has been found that applying a strain to the channel may improve functionality of the transistor. One way to apply such a strain is to deposit a material with a different lattice spacing than monocrystalline silicon on the wafer. Depending on the lattice spacing, a tensile or compressive strain may be induced in the channel.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1A:
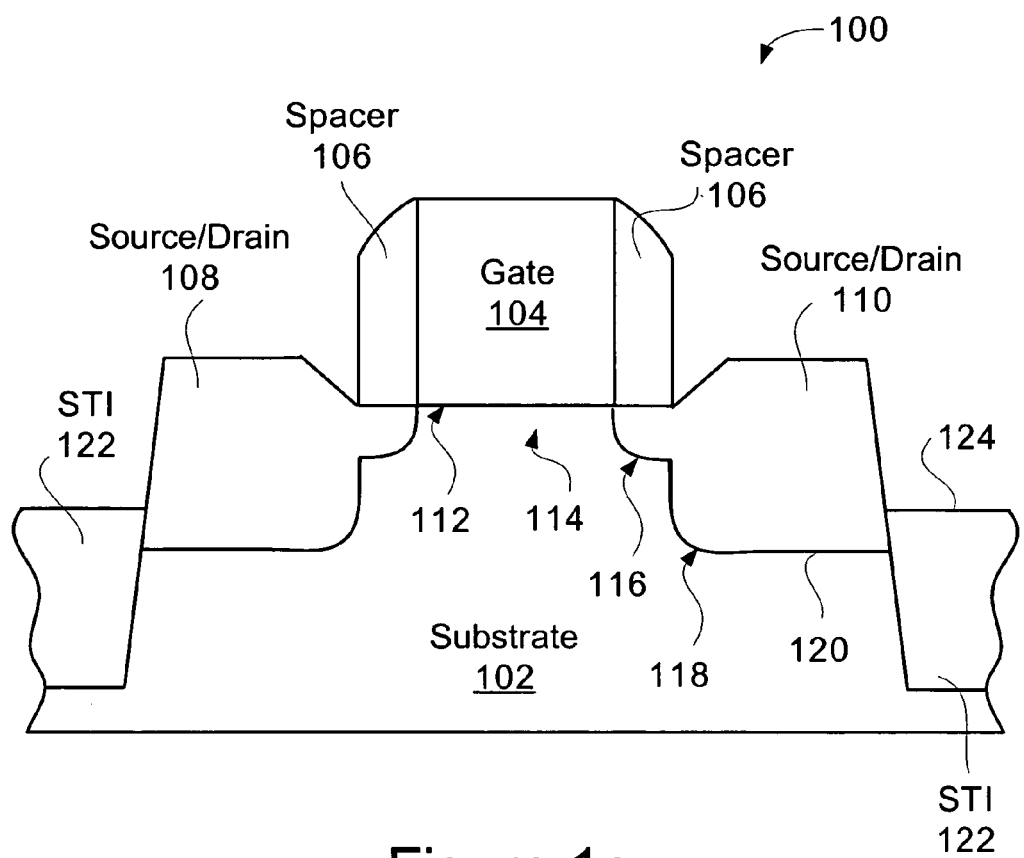
FIG. 1a is a cross sectional side view that illustrates a generalized transistor with stepped source/drain regions.

FIG. 1a is a cross sectional side view that illustrates a generalized transistor 100 with stepped source/drain regions 108, 110, according to one embodiment of the present invention. The description below is primarily concerned with embodiments in which a PMOS transistor 100 is formed. However, one skilled in the art will appreciate that an NMOS 100 transistor may be manufactured in a similar manner, but with some changes. For example, doping conductivity types, lattice spacing, and composition of the source/drain regions 108, 110 may be changed from those of PMOS transistors 100 to form an NMOS transistor 100.

The transistor 100 may include a substrate 102. The substrate 102 may comprise a piece of material, such as a piece of silicon or other material. The substrate 102 may be a physical structure, a layer that is a basic workpiece transformed and/or added to by various processes into the desired microelectronic configuration, or another material or materials. The substrate 102 may include conducting material, insulating material, semiconducting material, and other materials or material combinations. In some embodiments, the substrate 102 may be a multi-layered structure and may include active and/or passive devices. Alternatively, the substrate 102 may comprise a substantially homogeneous piece of material without additional devices or structures.

In an embodiment, the substrate 102 may include a monocrystalline wafer layer and an epitaxial silicon layer that may be epitaxially formed on the monocrystalline wafer substrate. Because such a silicon layer may be epitaxially formed, it may follow the monocrystalline crystal structure of the wafer substrate. The silicon of the silicon layer at the top surface of the substrate 102 may thus also be monocrystalline. The silicon layer may include an n-type dopant, which can be formed by implanting phosphorous and arsenic ions to produce an n-well, having an n-type dopant concentration of approximately $5.0 \times 10^{18}/cm^3$. (An N+ film is thus created.) Other dopants and doping concentrations may also be used in other embodiments. FIG. 1a only shows the epitaxial silicon layer at the top of the substrate 102; the non-epitaxial layer portion of the substrate 102 is not shown.

A plurality of field isolation regions 122 may be in the substrate 102. The field isolation regions 122 may isolate wells of different conductivity types, and isolate adjacent transistors. The field isolation regions 122 may, for example, be shallow trench isolation (STI) regions 122 and may be formed by etching a trench into the substrate 102, and then filling the trench with deposited oxide.

A gate 104 may be on a top surface 112 of the substrate 102. The gate 104 may include a gate dielectric layer that may be a layer such as a nitrided oxide layer. The gate 104 may also include a gate electrode on the gate dielectric layer. The gate electrode may be formed by blanket deposition of polysilicon, and patterning the polysilicon into the gate electrode utilizing known photolithographic techniques. The gate dielectric layer and gate electrode may also comprise other materials and be formed by other methods.

There may be gate spacer layers 106 on the sides of the gate 104. Adjacent the gate spacer layers 106 and extending away from the gate 104, there may be first and second stepped source/drain regions 108, 110. These stepped source/drain regions 108, 110 may be within stepped recesses in the substrate 102. The stepped source/drain regions 108, 110 may be epitaxially formed in the recesses. The stepped source/drain regions 108, 110 may include silicon, germanium, and boron, although in other embodiments they may include other materials.

In an embodiment, the silicon and the germanium of the source/drain regions 108, 110 form an alloy having a lattice which has the same structure as the structure of the lattice of the epitaxial silicon of the substrate 102. The lattice of the alloy of silicon and germanium, however, has a larger spacing than the spacing of the lattice of the epitaxial silicon of the substrate 102, at least in a relaxed state. Because the lattice of the alloy has the same structure as the substrate 102, the stepped source/drain regions 108, 110 form epitaxially on the substrate 102. However, because of the larger spacing of the lattice of the alloy, the stepped source/drain regions 108, 110 create a compressive stress (and strain) in a channel 114 between the stepped source/drain regions 108, 110. The germanium may be present in the combination of the silicon and the germanium in about 15 atomic percent, although other concentrations may be used in other embodiments. A relatively large boron concentration may also be included in the stepped source/drain regions 108, 110. The boron concentration may be approximately $3 \times 10^{20}/cm^3$ in an embodiment, although other concentrations may be used in other embodiments. (The stepped source/drain regions 108, 110 may thus be doped P+.) The relatively large concentration of boron may create a relatively low resistance of approximately 0.9 mOhm-cm, although the concentrations of boron or other dopants may create a different resistance in other embodiments. A conductive p-doped film may also be deposited on a surface of the gate electrode and form a portion of the gate 104.

The stepped source/drain regions 108, 110 may each include a shallower first step 116 and a deeper second step 118. There may be a smaller distance between the first steps 116 of the stepped source/drain regions 108, 110 than between the second steps 118. In an embodiment, the deeper second steps 118 may provide a desired amount of strain within the channel 114, and the more closely spaced shallower first steps 116 may provide a desired short channel effect (SCE) without much current leakage, compared to a situation with a deep unstepped source/drain region. In such a device without steps, in order to provide the desired strain, the recesses in which source/drain regions are formed may be too deep and too close together, resulting in a worse SCE and more current leakage. Other embodiments may include more than two steps as part of the source drain regions 108, 110.

In some embodiments, the bottom 120 of the stepped source/drain regions 108, 110 may be below the tops 124 of the field isolation regions 122. It is possible that etching and/or cleaning processes performed may result in the top surfaces 124 of the field isolation regions 122 being below the top surface 112 of the substrate 102. By providing stepped source/drain regions 108, 110 deep enough that their bottoms 120 are below the tops 124 of the field isolation regions 122, contact between subsequent layers applied on the transistor 100 and the substrate 102 material may be prevented. Undesired effects from such direct contact, such as nickel spike defects, which may occur if a layer including nickel is in direct contact with a silicon substrate 102 may also be prevented. In embodiments where the bottom 120 of the stepped source/drain regions 108, 110 are below the tops 124 of the field isolation regions 122, the overlap between the stepped source/drain regions 108, 110 and the field isolation regions 122 may prevent such direct contact and thus prevent such nickel spike defects or other problems. Thus, the depth of the second steps 118 may also provide additional benefits beyond a desired strain in the channel 114. In other embodiments, the bottom 120 of the stepped source/drain regions 108, 110 may be above or on a level with the tops 124 of the field isolation regions 122.

Figure 1B:
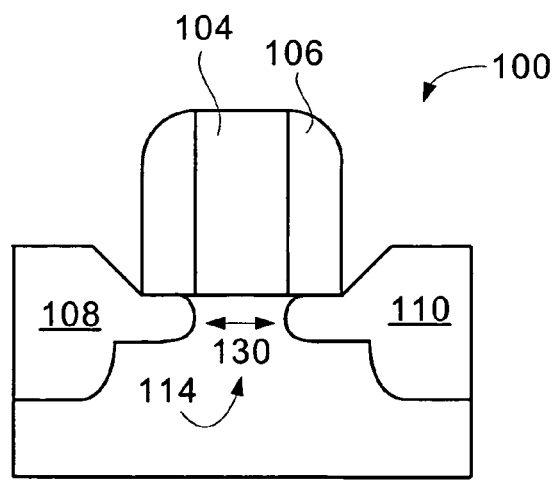
FIG. 1b is a cross sectional side view that illustrates tensile strain in the channel of a transistor.

FIG. 1b is a cross sectional side view that illustrates tensile strain 130 in the channel 114 of a transistor 100 similar to that described above with respect to FIG. 1a. The tensile strain 130 may be generated by a difference in lattice spacings between the material of which the stepped source/drain regions 108, 110 are comprised and the material of which the substrate 102 is comprised. Such materials may be chosen to create a desired resulting strain 130. In an embodiment, the source/drain regions 108, 110 may comprise silicon and carbon. The tensile strain 130 may be desired, for example, when forming an NMOS transistor 100.

Figure 1C:
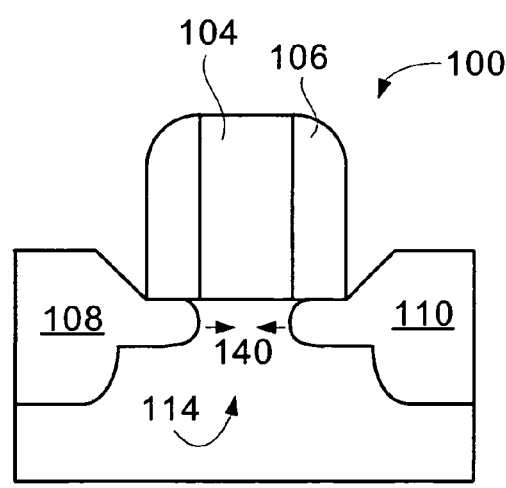
FIG. 1c is a cross sectional side view that illustrates compressive strain in the channel of a transistor.

FIG. 1c is a cross sectional side view that illustrates compressive strain 140 in the channel 114 of a transistor 100 similar to that described above with respect to FIG. 1a. The compressive strain 140 may be generated by a difference in lattice spacings between the material of which the stepped source/drain regions 108, 110 are comprised and the material of which the substrate 102 is comprised. Such materials may be chosen to create a desired resulting strain 140. In an embodiment, the source/drain regions 108, 110 may comprise silicon and germanium. The compressive strain 140 may be desired, for example, when forming an PMOS transistor 100.

Figure 2:
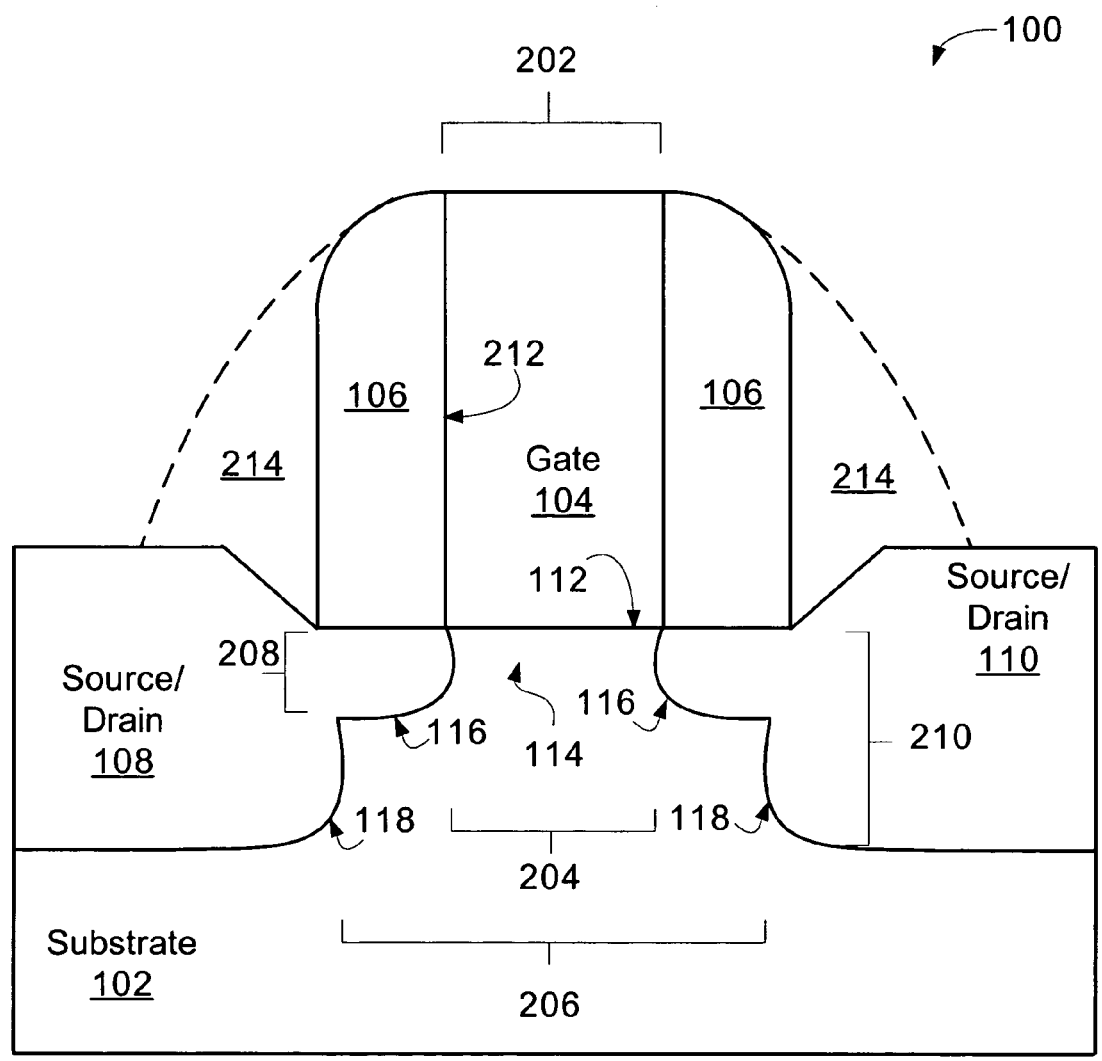
FIG. 2 is a cross sectional side view that illustrates in more detail a portion of the generalized transistor with stepped source/drain regions.

FIG. 2 is a cross sectional side view that illustrates in more detail a portion of the generalized transistor 100 with stepped source/drain regions 108, 110, according to one embodiment of the present invention. The gate 104 may have a width 202. This width 202 may vary in various embodiments. In an embodiment, the gate 104 may have a width 202 between about 40 nm and about 60 nm, although in other embodiments, the width 202 may be larger or smaller. There may also be a smallest distance 204 between the first steps 116 of the stepped source/drain regions 108, 110. In an embodiment, the distance 204 may be about equal to the width 202 of the gate 104 or smaller. In another embodiment, the distance 204 may be between about the width 202 of the gate 104 and about one half the width 202 of the gate 104. Other embodiments may have distances 204 in different ratios to the width 202 of the gate 104.

The transistor 100 may also have a smallest distance 206 between the second steps 118 of the stepped source/drain regions 108, 110. The smallest distance 206 between the second steps 118 may be greater than the smallest distance 204 between the first steps 116. In an embodiment, the distance 206 may be between about twice the width 202 of the gate 104 and about one and a half times the width 202 of the gate 104. In an embodiment, the distance 206 may be between about one and a half times the width 202 of the gate 104 and about the width 202 of the gate 104. Other embodiments may have distances 206 in different ratios to the width 202 of the gate 104.

The first steps 116 of the stepped source/drain regions 108, 110 may have a first depth 208 beneath a top surface 112 of the substrate 102. The first depth 208 may be related to the gate width 202 in a ratio. In an embodiment, the first depth 208 may be between about one fourth of the width 202 of the gate 104 and about three fourths of the width 202 of the gate 104. In other embodiments, there may be a different relationship between the width 202 of the gate 104 and the first depth 208 of the first steps 116.

The second steps 118 of the stepped source/drain regions 108, 110 may have a second depth 210 beneath a top surface 112 of the substrate 102. The second depth 210 may be related to the gate width 202 in a ratio. In an embodiment, the second depth 210 may be between about three times the width 202 of the gate 104 and about six times the width 202 of the gate 104. In other embodiments, there may be a different relationship between the width 202 of the gate 104 and the second depth 210 of the second steps 118. The second depth 210 of the second steps 118 may be chosen to provide a desired strain in the channel 114.

As discussed above with respect to FIG. 1a, there may be first spacer layers 106 on the side walls 212 of the gate 104. These spacer layers 106 may cover sides of the gate 104 and also cover portions of the surface of the substrate 102 and/or portions of the surface of the stepped source/drain regions 108, 110. In some embodiments, there may also be second spacer layers 214. The second spacer layers 214 may be on the first spacer layers 106 so that the first spacer layers 106 are between the second spacer layers 214 and the gate 104. The second spacer layers 214 may cover portions of the substrate 102 and/or portions of the surface of the stepped source/drain regions 108, 110 that are further from the gate 104 than portions covered by the first spacer layers 106. In some embodiments, the spacer layers 106, 214 may comprise one or more of silicon oxide, silicon nitride, or silicon oxynitride, although other materials may be used. The first spacer layers 106 may comprise the same material as the second spacer layers 214, or may comprise different material than the second spacer layers 214.

Figure 3:
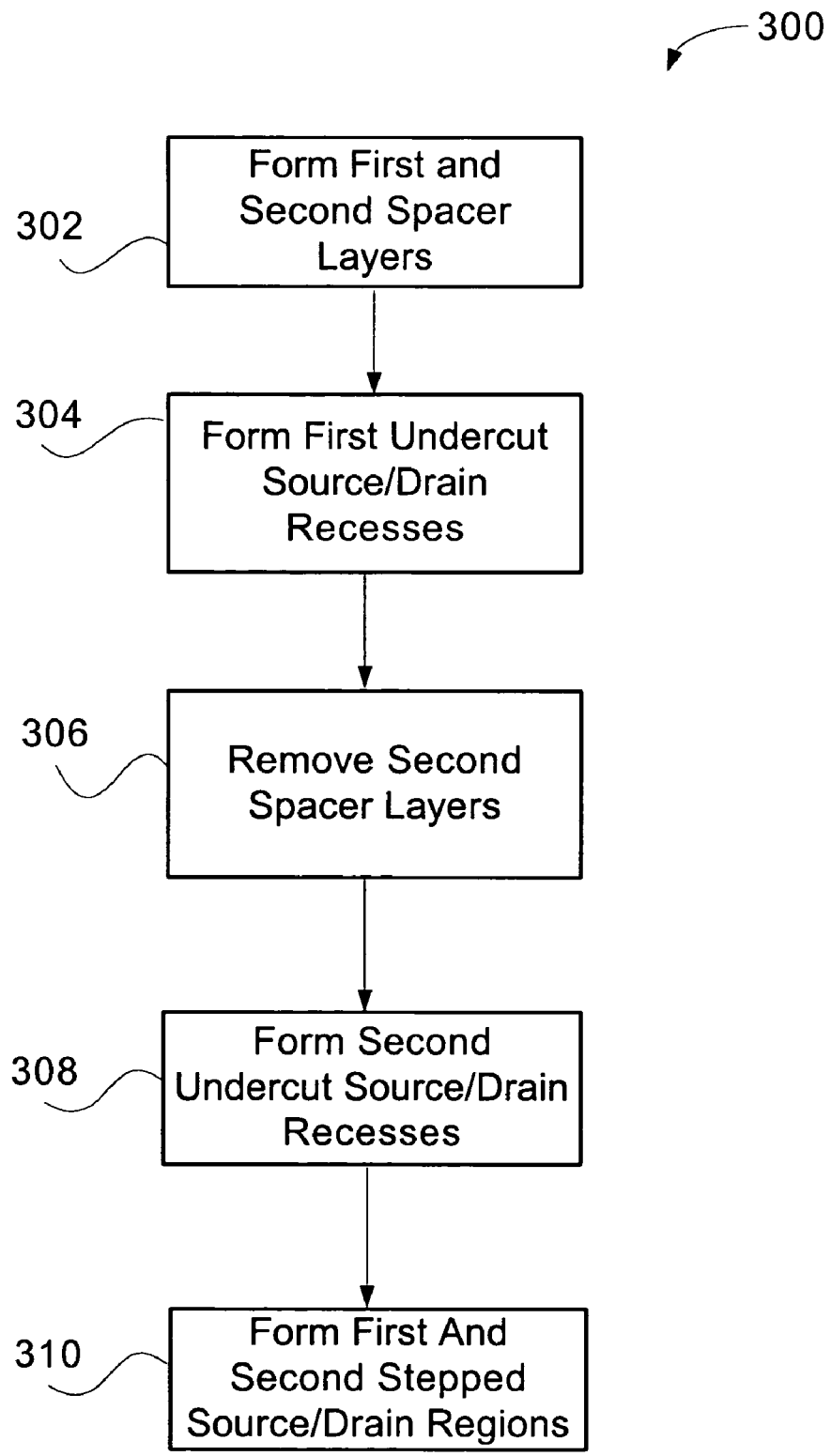
FIG. 3 is a flow chart showing how the transistor may be fabricated, according to one embodiment of the present invention.

FIG. 3 is a flow chart 300 showing how the transistor 100 may be fabricated, according to one embodiment of the present invention. FIGS. 4a through 4g are cross sectional side views that illustrate various stages in fabricating the transistor 100 according to the process shown in the flow chart 300 of FIG. 3.

Figure 4A:
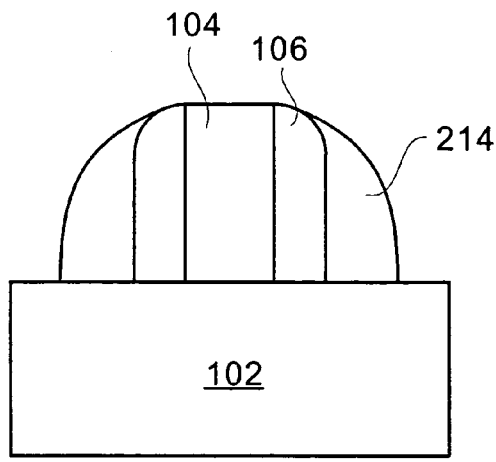
FIGS. 4a through 4g are cross sectional side views that illustrate various stages in fabricating the transistor according to the process shown in the flow chart of FIG. 3.

Referring to FIG. 3, the first and second spacer layers 106, 214 may be formed 302 on the substrate 102 and on the side walls of the gate 104. FIG. 4a is a cross sectional side view that illustrates the first and second spacer layers 106, 214 formed 302 on the substrate 102. Formation 302 of the first and second spacer layers 106, 214 may be accomplished by any suitable process.

Figure 4B:
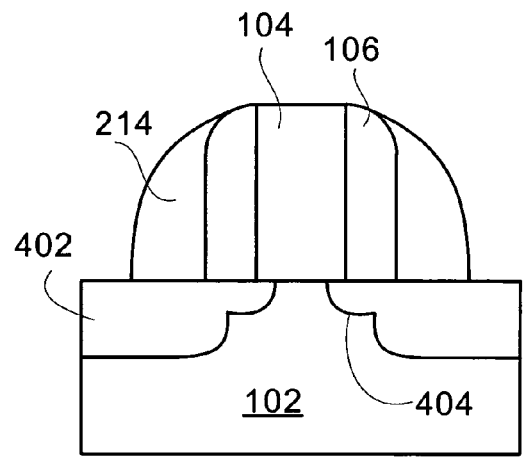

FIG. 4b is a cross sectional side view that illustrates doped regions 402 of the substrate 102, including doped tip junction regions 404 of the substrate 102, that may optionally be formed in some embodiments. Such doped 402 and doped tip junction regions 404 may be formed prior to and/or during formation of the first and second spacer layers 106, 214. For example, in an embodiment, prior to formation of the first spacer layers 106, dopant ions, such as boron or other ions, may be implanted into an exposed upper surface of the substrate 102 to form a shallow doped region of about the depth of the doped tip junction regions 404. The first spacer layers 106 may then be formed. After formation of the first spacer layers 106, dopant ions may again be implanted into exposed upper surfaces of the substrate 102 to form the deeper doped regions 402 of the substrate 102. A heat treatment may then be carried out to anneal the doped regions 402, 404 and cause the regions 402, 404 to extend further into the substrate 102 by diffusion. The second spacer layers 214 may then be formed. For the sake of simplicity, the doped regions 402, 404 will not be shown or discussed in most of the other Figures. While not discussed for each embodiment, such doped regions 402, 404 may be formed in other embodiments of the invention described herein. However, embodiments may lack the doped regions 402, 404. In yet other embodiments, only shallower tip junction regions may be doped, and not the deeper doped regions 402.

Figure 4C:
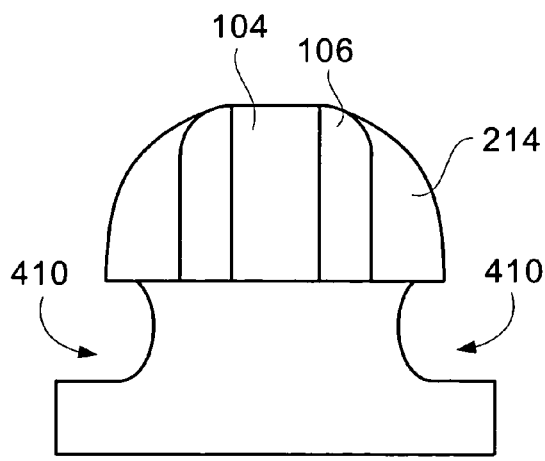

Returning to FIG. 3, first undercut source/drain recesses may be formed 304. FIG. 4c is a cross sectional side view that illustrates the first undercut source/drain recesses 410. The first undercut source/drain recesses 410 may be formed by a suitable etching process. The first undercut source/drain recesses 410 may be formed to the desired depth 210 of the second steps 118. This depth 210 may be chosen to provide a desired strain in the channel 114 and/or to provide overlap between the source/drain regions 108, 110 and the field isolation regions 122 in some embodiments. The second spacer layers 214 may protect the substrate 102 beneath from the etching process to some extent. However, the etching process may undercut the spacers 214 and thus the smallest distance 206 between the second steps 118 may be smaller than a distance between outer edges of the second spacer layers 214. The second spacer layers 214 may prevent the first undercut source/drain recesses 410 from being too close to each other and thereby create excessive leakage current. The undercut of the first undercut source/drain recesses 410 may extend past the boundaries of the second spacer layers 214 in an embodiment. In another embodiment, the etching that creates the first undercut source/drain recesses 410 may be anisotropic and undercutting of the second spacer layers 214 may be avoided; the first undercut source/drain recesses 410 may not actually undercut the spacer layers 106, 214, but may instead simply extend downward into the substrate 102 along the boundary of the second spacer layers 214 and substrate 102 material covered by the second spacer layers 214 may be protected from etching.

Figure 4D:
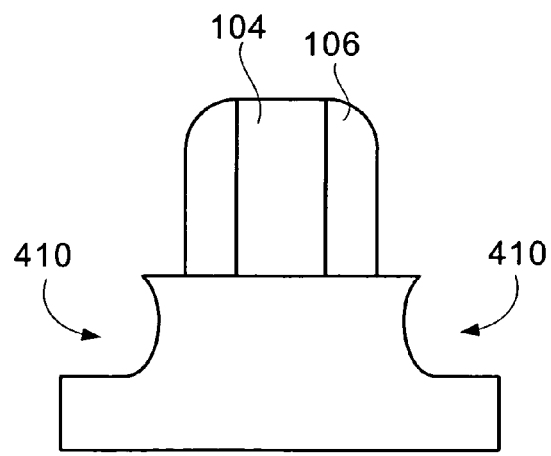

Referring again to FIG. 3, the second spacer layers 214 may be removed 306. FIG. 4d is a cross sectional side view that illustrates the transistor 100 after removal 306 of the second spacer layers 214. The substrate 102 surface left by formation of the first undercut source/drain recesses 410 may be beyond the first spacer layers 106 in an embodiments, although it may not in other embodiments.

Figure 4E:
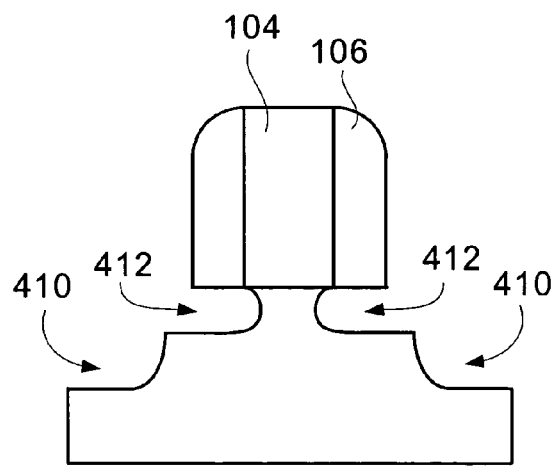

Returning to FIG. 3, second undercut source/drain recesses may be formed 308. FIG. 4e is a cross sectional side view that illustrates the second undercut source/drain recesses 412. The second undercut source/drain recesses 412 may be formed by any suitable etching process. The second undercut source/drain recesses 412 may be formed to the desired depth 208 of the first steps 116. This depth 208 may be chosen to provide a desired short channel effect in the channel 114 without excessive current leakage in some embodiments. The first spacer layers 106 may protect the substrate 102 beneath from the etching process to some extent. However, the etching process may undercut the first spacer layers 106 and thus the smallest distance 204 between the first steps 116 may be smaller than a distance between outer edges of the first spacer layers 106, and may be smaller than a width 202 of the gate 104. The undercut of the second undercut source/drain recesses 412 may extend past the boundaries of the first spacer layers 106 in an embodiment. In another embodiment, the etching that creates the second undercut source/drain recesses 412 may be anisotropic and undercutting of the first spacer layers 106 may be avoided; the second undercut source/drain recesses 412 may simply extend downward into the substrate 102 along the boundary of the first spacer layers 106 and substrate 102 material covered by the first spacer layers 106 may be protected from etching.

Thus, by creating stepped source drain recesses that include both the first and second recesses 410, 412, some embodiments of the present invention may allow for deep source/drain regions 108, 110 that will provide the desired strain and/or overlap the field isolation regions 122, and also provide closely spaced shallow steps 116 of the source/drain regions 108, 110 for a beneficial short channel effect. Excessive current leakage that may occur were the deep recesses to extend close to each other may be avoided in some embodiments by keeping the distance 206 between the deep recesses 410 relatively large, so that only the shallow recesses 412 extend close to each other at a small distance 204.

Figure 4F:
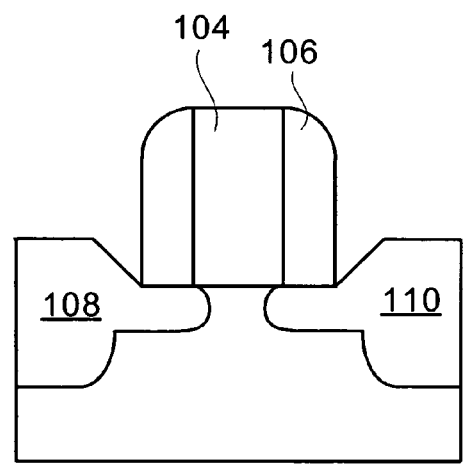

Referring again to FIG. 3, the first and second stepped source/drain regions 108, 110 may be formed 310. FIG. 4f is a cross sectional side view that illustrates the first and second stepped source/drain regions 108, 110 according to one embodiment of the present invention. The first and second stepped source/drain regions 108, 110 may be stepped as a result of being formed conformally to fill the stepped recesses 410, 412. The first and second stepped source/drain regions 108, 110 may have a top surface that extends above the top surface 112 of the substrate 102. In other embodiments, the stepped source/drain regions 108, 110 may have a top surface that is below or even with the top surface 112 of the substrate 102.

The first and second stepped source/drain regions 108, 110 may be epitaxially formed in the recesses 410, 412, although other methods to form 310 the stepped source/drain regions 108, 110 may be used. In an embodiment, the first and second stepped source/drain regions 108, 110 include silicon, germanium, and boron, although in other embodiments the first and second stepped source/drain regions 108, 110 may comprise other materials. In an embodiment, the first and second stepped source/drain regions 108, 110 may be formed in a chemical vapor deposition chamber with the following processing conditions: dichlorosilane of 20 sccm, diborane of 70 sccm at 1% concentration, and germane of 50 sccm, at a temperature of 740° C., although other processing conditions may be used.

The silicon and the germanium may form an alloy having a lattice which has the same structure as the structure of the lattice of the epitaxial silicon of the substrate 102 in an embodiment. The lattice of the alloy of silicon and germanium in the stepped source/drain regions 108, 110, however, has a larger spacing than the spacing of the lattice of the epitaxial silicon of the substrate 102, at least in a relaxed state. Because the lattice of the alloy in the stepped source/drain regions 108, 110 has the same structure as the substrate 102, the stepped source/drain regions 108, 110 may form epitaxially on the substrate 102. However, because of the larger spacing of the lattice of the alloy, the stepped source/drain regions 108, 110 create a compressive stress in the channel 114. The germanium is present in the combination of the silicon and the germanium in about 15 atomic percent in an embodiment, although it may be present in different amounts in other embodiments. A relatively large boron concentration may also be included in the stepped source/drain regions 108, 110. (The stepped source/drain regions 108, 110 are thus doped P+ in this embodiment.) The boron concentration may be approximately $3 \times 10^{20}/cm^3$ in an embodiment. In another embodiment, the concentration of boron or another dopant may be about $0.5 \times 10^{20}/cm^3$ or above, although different amounts of dopants may be included in other embodiments. The relatively large concentration of boron may create a relatively low resistance of approximately 0.9 mOhm-cm in an embodiment. In other embodiments, such as when making an NMOS transistor 100, different materials than silicon and germanium may be used with different lattice spacings to create a different strain in the channel 114. For example, silicon and carbon may be used instead of silicon and germanium.

Figure 4G:
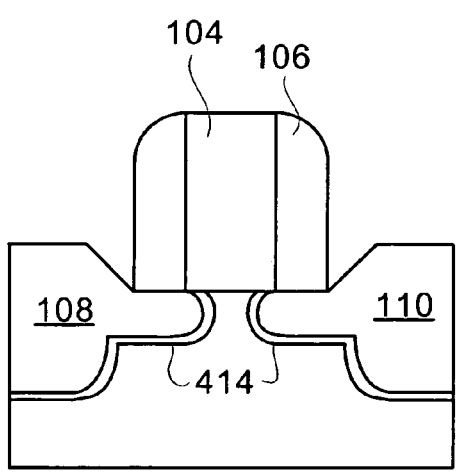

FIG. 4g is a cross sectional side view that illustrates an embodiment where the optional doped regions 402, 404 were formed as described with respect to FIG. 4b. In such an embodiment, the recesses 410, 412 may be formed so as not to remove all of the doped regions 402, 404 of the substrate 102. Rather, there may be a portion of the doped regions 402, 404 left behind after forming the recesses 410, 412. This may result in a thin layer of remaining doped regions 414 adjacent the recesses 410, 412 and the stepped source/drain regions 108, 110. Such an embodiment is optional, and such doped regions 402, 404 may be lacking in some embodiments so that remaining doped regions 414 may be lacking in some embodiments. The remaining embodiments described below will not include descriptions of such doped regions 402, 404, 414, but one of skill in the art may modify the remaining embodiments described below to include such doped regions 402, 404, 414. In other embodiments where only the tip junction region was doped, and not the deeper region 402, there may only be doped tip junction regions at the interior of the stepped source/drain regions 108, 110; the remaining doped regions may not extend below the first step 412 and/or may not extend along the periphery of the second step 410.

Figure 5:
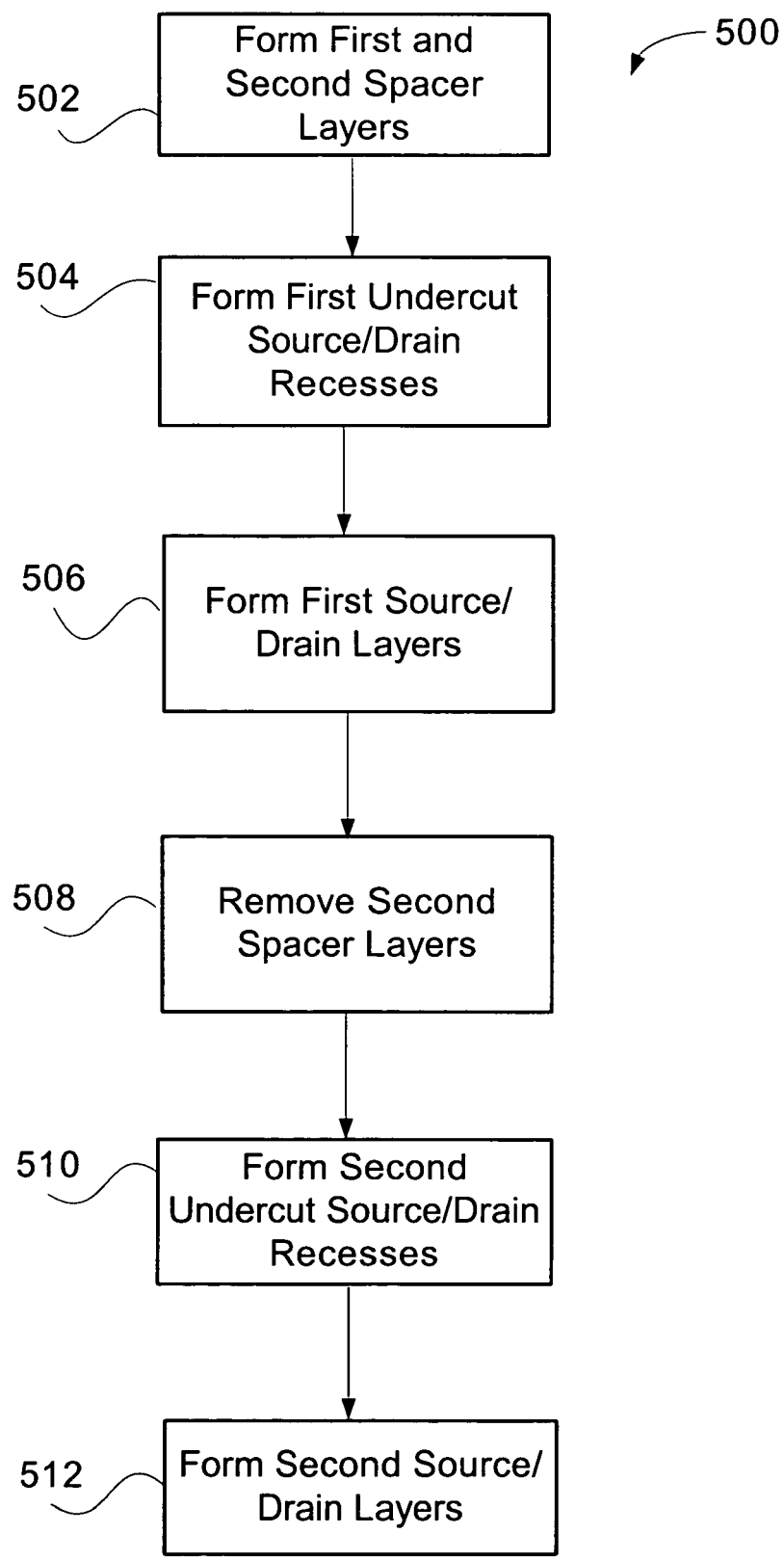
FIG. 5 is a flow chart howing how the transistor may be fabricated, according to another embodiment of the present invention.

FIG. 5 is a flow chart 500 showing how the transistor 100 may be fabricated, according to another embodiment of the present invention. FIGS. 6a through 6f are cross sectional side views that illustrate various stages in fabricating the transistor 100 according to the process shown in the flow chart 500 of FIG. 5.

Figure 6A:
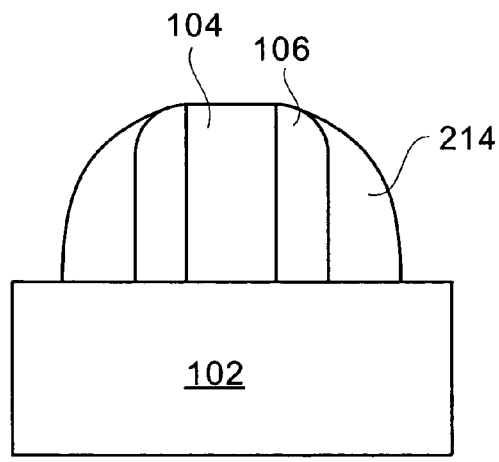
FIGS. 6a through 6f are cross sectional side views that illustrate various stages in fabricating the transistor according to the process shown in the flow chart of FIG. 5.

Referring to FIG. 5, the first and second spacer layers 106, 214 may be formed 502 on the substrate 102. FIG. 6a is a cross sectional side view that illustrates the first and second spacer layers 106, 214 formed 502 on the substrate 102 and on the side walls of the gate 104. Formation 502 of the first and second spacer layers 106, 214 may be accomplished by any suitable process.

Figure 6B:
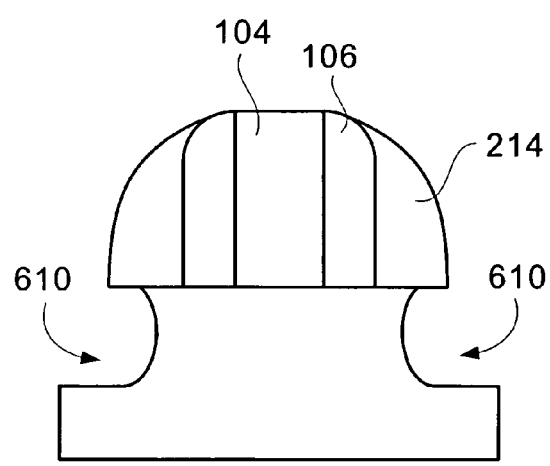

Returning to FIG. 5, first undercut source/drain recesses may be formed 504. FIG. 6b is a cross sectional side view that illustrates the first undercut source/drain recesses 610. The first undercut source/drain recesses 610 may be similar to the first undercut source/drain recesses 410 described above with respect to FIGS. 3 and 4, and may formed in a similar manner.

Figure 6C:
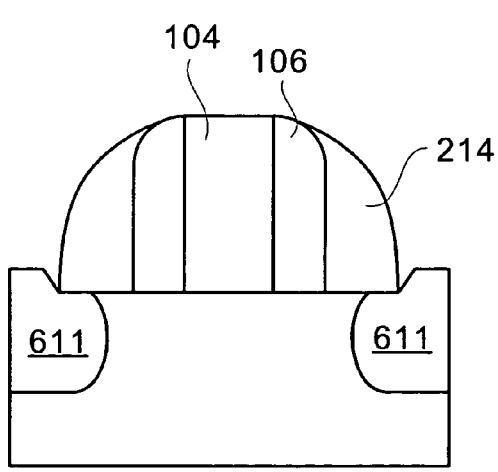

Returning to FIG. 5, first source/drain layers may be formed 506. FIG. 6c is a cross sectional side view that illustrates the first source/drain layer 611 formed in the first undercut source/drain recesses 610 according to one embodiment of the present invention. The first source/drain layer 611 may form the second steps 118 of the first and second stepped source/drain regions 108, 110. The first source/drain layer 611 may be formed in a similar manner and may comprise similar materials to the single layer that forms the first and second stepped source/drain regions 108, 110 as described with respect to FIGS. 3 and 4, above.

Figure 6D:
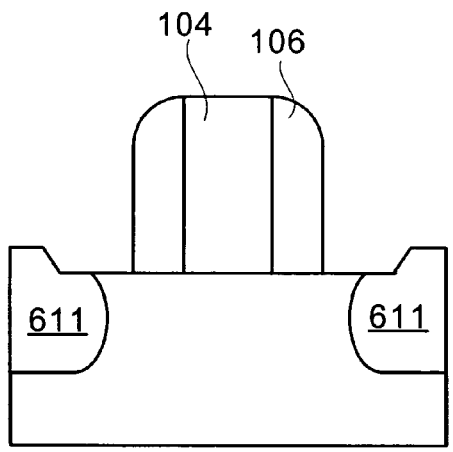

Referring again to FIG. 5, the second spacer layers 214 may be removed 508. FIG. 6d is a cross sectional side view that illustrates the transistor 100 after removal 508 of the second spacer layers 214. The substrate 102 surface left by formation of the first undercut source/drain recesses 610 may be beyond the first spacer layers 106 in an embodiments, although it may not in other embodiments. Portions of the surfaces of the first source/drain layer 611 formerly covered by the second spacer layers 214 may be exposed after removal of the second spacer layers 214.

Figure 6E:
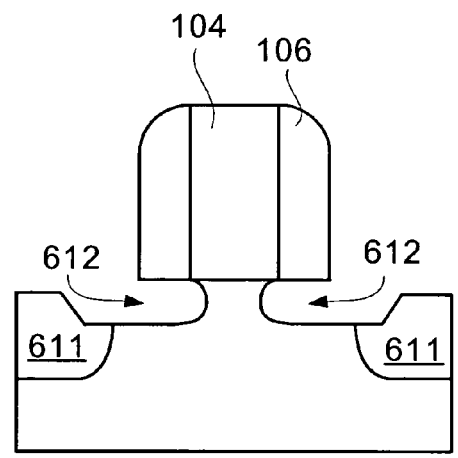

Returning to FIG. 5, second undercut source/drain recesses may be formed 510. FIG. 6e is a cross sectional side view that illustrates the second undercut source/drain recesses 612. The second undercut source/drain recesses 612 may be similar to the second undercut source/drain recesses 412 described above with respect to FIGS. 3 and 4, and may formed in a similar manner. The formation 510 of the second undercut source/drain recesses 612 may remove some material of the first source/drain layer 611.

Figure 6F:
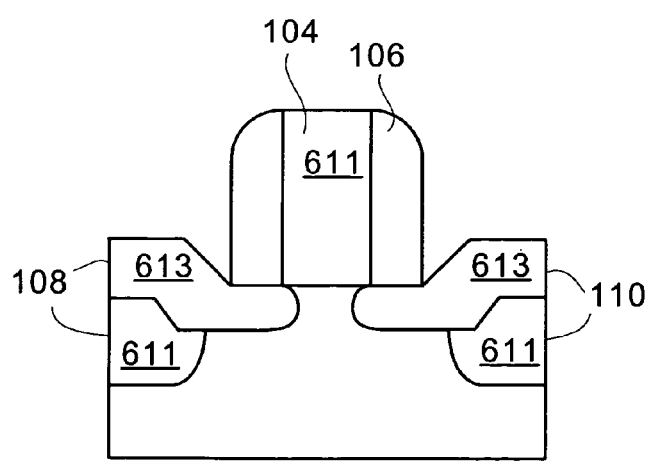

Returning to FIG. 5, second source/drain layers may be formed 512. FIG. 6f is a cross sectional side view that illustrates the second source/drain layer 613 formed in the second undercut source/drain recesses 612 and partially on the first source/drain layer 611 according to one embodiment of the present invention. The second source/drain layer 613 may form the first steps 116 of the first and second stepped source/drain regions 108, 110. The second source/drain layer 613 may be formed in a similar manner and may comprise similar materials to the single layer that forms the first and second stepped source/drain regions 108, 110 as described with respect to FIGS. 3 and 4, above.

Thus, by creating stepped source drain recesses that include both the first and second recesses 610, 612, and forming the first and second source/drain layers 611, 613, some embodiments of the present invention may allow for source/drain regions 108, 110 with deep steps 118 (of the first source/drain layer 611) that may provide the desired strain and/or overlap the field isolation regions 122, and also provide closely spaced shallow steps 116 (of the second source/drain layer 613) of the source/drain regions 108, 110 for a beneficial short channel effect. Excessive current leakage that may occur were the deep recesses 610 (and first source/drain layers 611) to extend close to each other may be avoided in some embodiments by keeping the distance 206 between the deep recesses 610 relatively large, so that only the shallow recesses 612 (and shallow second source/drain layers 613) extend close to each other at a small distance 204.

Figure 7:
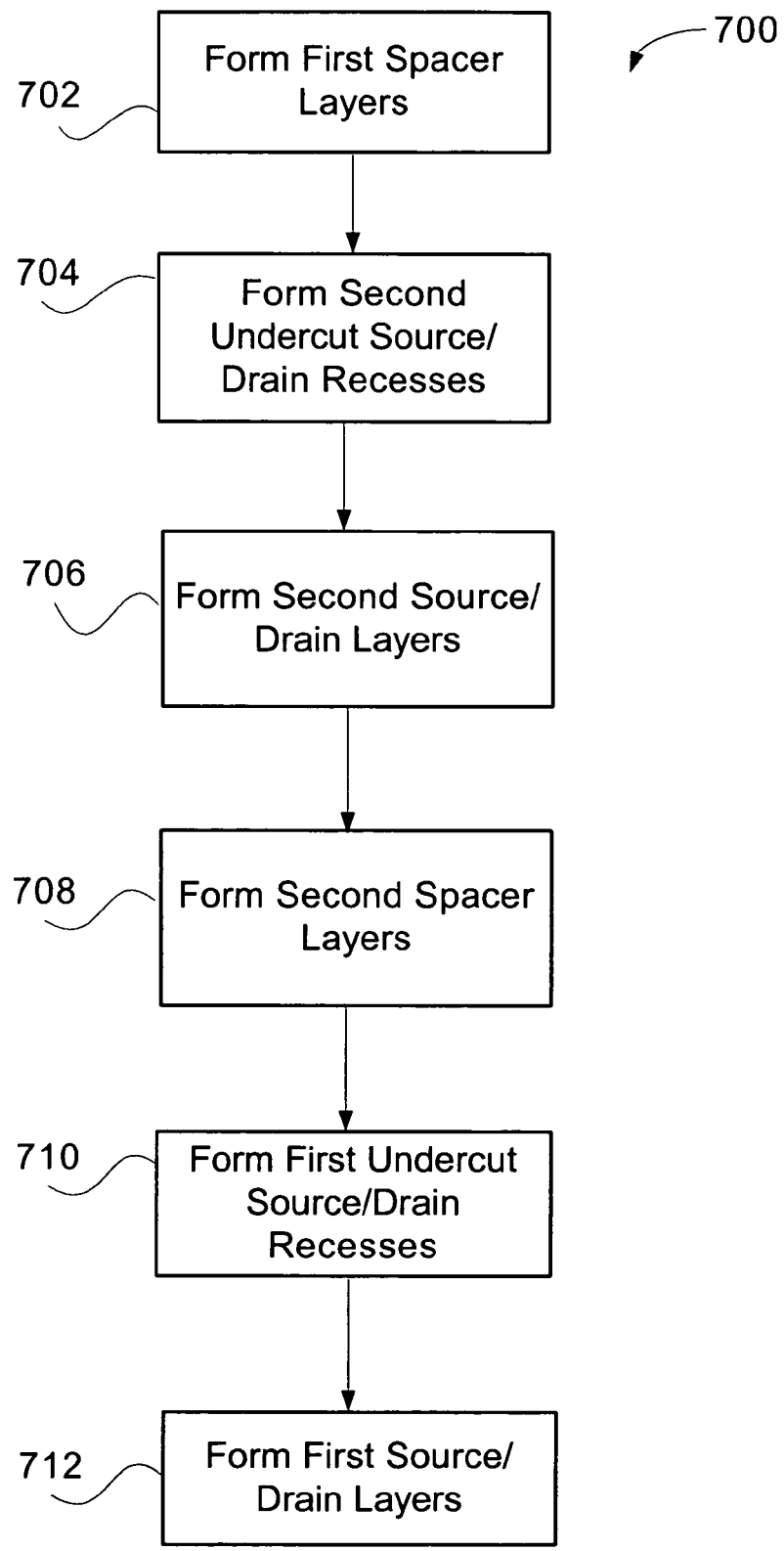
FIG. 7 is a flow chart showing how the transistor may be fabricated, according to yet another embodiment of the present invention.

FIG. 7 is a flow chart 700 showing how the transistor 100 may be fabricated, according to yet another embodiment of the present invention. FIGS. 8a through 8f are cross sectional side views that illustrate various stages in fabricating the transistor 100 according to the process shown in the flow chart 700 of FIG. 7.

Figure 8A:
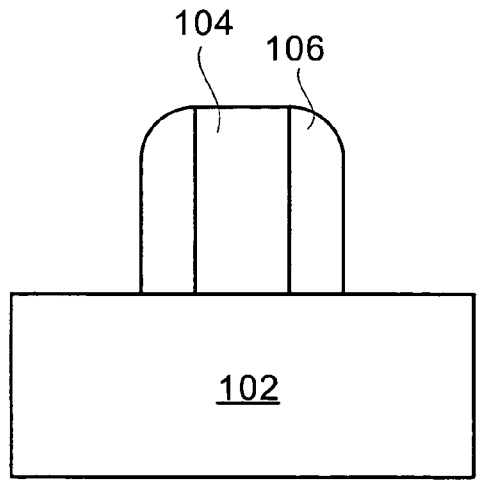
FIGS. 8a through 8f are cross sectional side views that illustrate various stages in fabricating the transistor according to the process shown in the flow chart of FIG. 7.

Referring to FIG. 7, the first spacer layers 106 may be formed 702 on the substrate 102. FIG. 8a is a cross sectional side view that illustrates the first spacer layers 106 formed 702 on the substrate 102 and on the side walls of the gate 104. Formation 702 of the first spacer layers 106 may be accomplished by any suitable process.

Figure 8B:
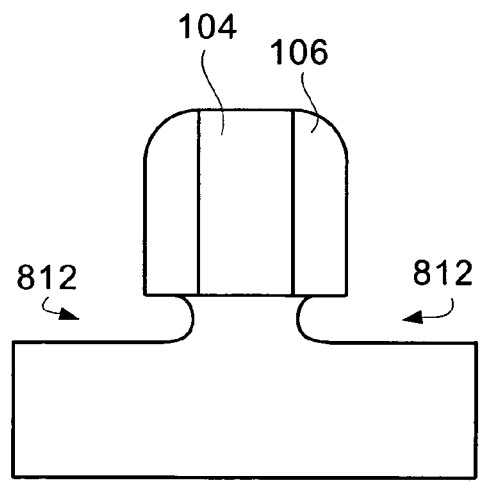

Returning to FIG. 7, second undercut source/drain recesses may be formed 04. FIG. 8b is a cross sectional side view that illustrates the second undercut source/drain recesses 812. The second undercut source/drain recesses 812 may be similar to the second undercut source/drain recesses 412 described above with respect to FIGS. 3 and 4, and may formed in a similar manner. They are however, formed prior to the deeper first undercut source/drain recesses. The second undercut source/drain recesses 812 may define the depth 208 of the first steps 116 and the smallest distance 204 between the two first steps 116.

Figure 8C:
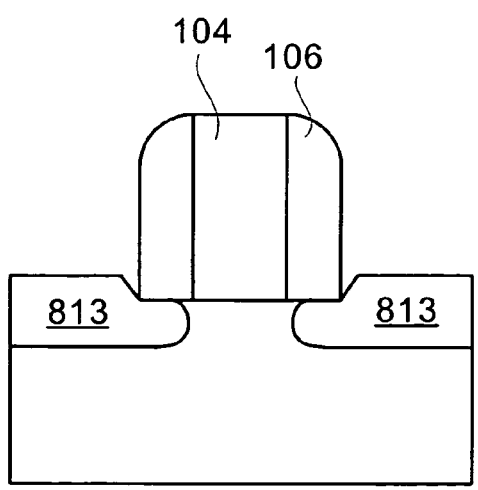

Returning to FIG. 7, second source/drain layers may be formed 806. FIG. 8c is a cross sectional side view that illustrates the second source/drain layer 813 formed in the second undercut source/drain recesses 812 according to one embodiment of the present invention. The second source/drain layer 813 may form the first steps 116 of the first and second stepped source/drain regions 108, 110. The second source/drain layer 813 may be formed in a similar manner and may comprise similar materials to the single layer that forms the first and second stepped source/drain regions 108, 110 as described with respect to FIGS. 3 and 4, above. Also, as illustrated in FIG. 8c, the second source/drain layer 813 may have a top surface above the top surface of the substrate 102 in some embodiments.

Figure 8D:
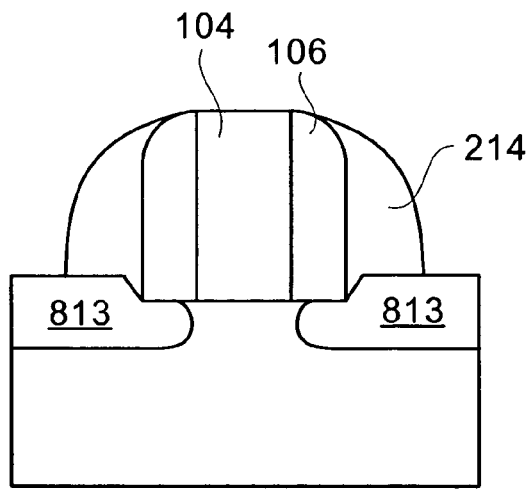

Referring again to FIG. 7, the second spacer layers 214 may be formed 708. FIG. 8d is a cross sectional side view that illustrates the transistor 100 after formation 808 of the second spacer layers 214. The second spacer layers 214 may be adjacent the first spacer layers 106 and cover a portion of the surface of the second source/drain layer 813. Formation 708 of the second spacer layers 214 may be accomplished by any suitable process.

Figure 8E:
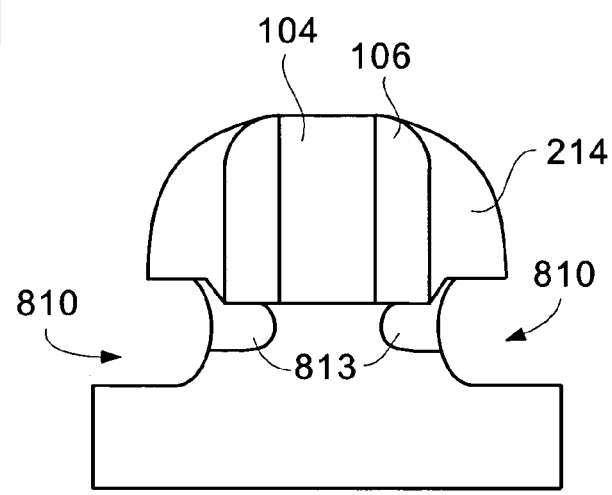

Returning to FIG. 7, first undercut source/drain recesses may be formed 710. FIG. 8e is a cross sectional side view that illustrates the first undercut source/drain recesses 810. The first undercut source/drain recesses 810 may be similar to the first undercut source/drain recesses 410 described above with respect to FIGS. 3 and 4, and may formed in a similar manner. The formation 710 of the first undercut source/drain recesses 810 may remove some material of the second source/drain layer 813.

Figure 8F:
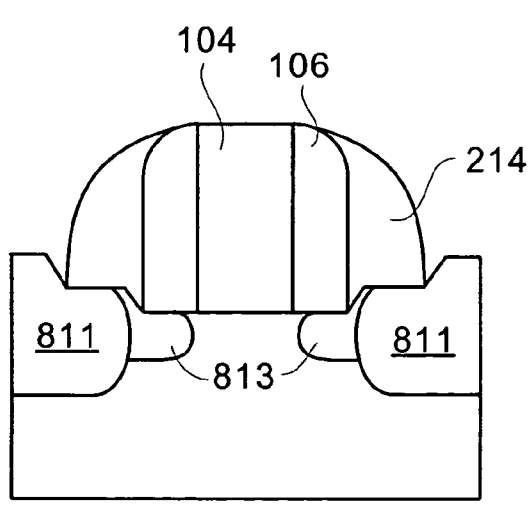

Returning to FIG. 7, first source/drain layers may be formed 712. FIG. 8f is a cross sectional side view that illustrates the first source/drain layer 811 formed in the first undercut source/drain recesses 810 according to one embodiment of the present invention. The first source/drain layer 811 may form the second steps 118 of the first and second stepped source/drain regions 108, 110. The first source/drain layer 811 may be formed in a similar manner and may comprise similar materials to the single layer that forms the first and second stepped source/drain regions 108, 110 as described with respect to FIGS. 3 and 4, above. Also, as illustrated in FIG. 8f, the first source/drain layer 811 may have a top surface above the top surface of the substrate 102 and above the top surface of the second source/drain layer 813 in some embodiments. The second spacer layers 214 may then be removed in some embodiments, although in some embodiments, the second spacer layers 214 may be left in place in the final product.

Thus, by creating stepped source drain recesses that include both the first and second recesses 810, 812, and forming the first and second source/drain layers 811, 813, some embodiments of the present invention may allow for source/drain regions 108, 110 with deep steps 118 (of the first source/drain layer 811) that may provide the desired strain and/or overlap the field isolation regions 122, and also provide closely spaced shallow steps 116 (of the second source/drain layer 813) of the source/drain regions 108, 110 for a beneficial short channel effect. Excessive current leakage that may occur were the deep recesses 810 (and first source/drain layers 811) to extend close to each other may be avoided in some embodiments by keeping the distance 206 between the deep recesses 810 relatively large, so that only the shallow recesses 812 (and shallow second source/drain layers 813) extend close to each other at a small distance 204.

Figure 9:
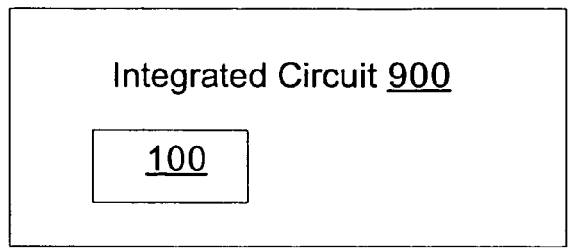
FIG. 9 is a schematic view that illustrates an integrated circuit that may include the transistor.

FIG. 9 is a schematic view that illustrates an integrated circuit 900 that may include the transistor 100 as illustrated in the Figures and described above. The integrated circuit 900 may be any type of integrated circuit 900. For example, the integrated circuit 900 may be a microprocessor. In an embodiment, the transistor 100 may be used in the integrated circuit 900 to provide a transistor 100 with desired strain in the channel region 114 from the deeper second step 118 and also improved short channel effect from the shallower and closer first step 116. While illustrated as part of an integrated circuit 900, the transistor 100 is not limited to inclusion in such devices. Nor is the type of integrated circuit 900 limited to microprocessors; other types of circuits may benefit from use of the transistor as described herein.

Figure 10:
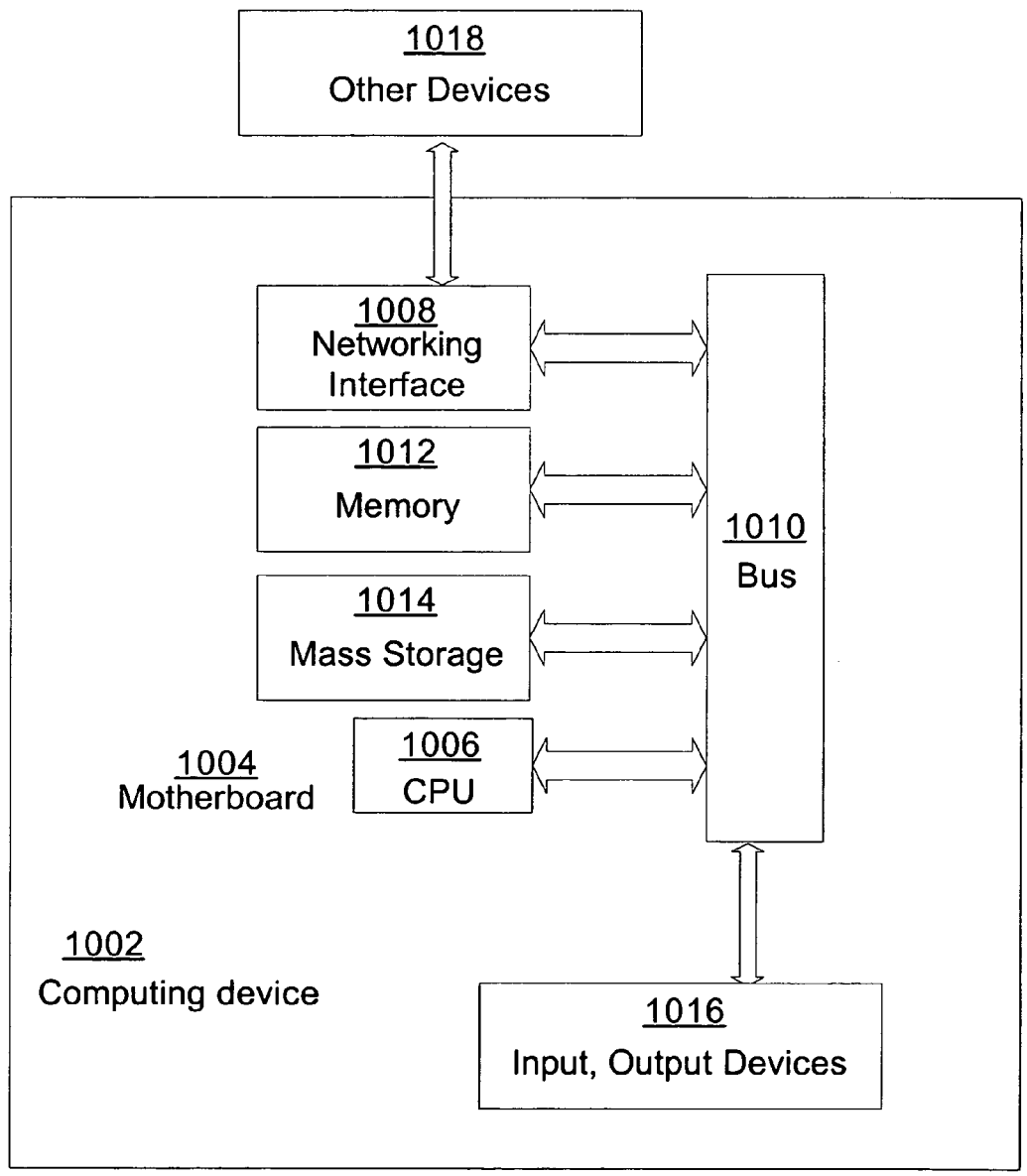
FIG. 10 is a block diagram that illustrates a system in accordance with one embodiment of the present invention.

FIG. 10 is a block diagram that illustrates a system 1000 in accordance with one embodiment of the present invention. As illustrated, for the embodiment, system 1000 includes a computing device 1002 for processing data. Computing device 1002 may include a motherboard 1004. Motherboard 1004 may include in particular a processor 1006, and a networking interface 1008 coupled to a bus 1010. The networking interface 1008 may connect the computing device 1002 to other devices 1008, such as other computing devices 1002.

Depending on the applications, system 1000 may include other components, including but are not limited to volatile and non-volatile memory 1012, a graphics processor (which may be integrated with a motherboard along with a chipset, or alternatively may be an expansion card, such as AGP, PCI Express or other type, removably inserted into a socket on a motherboard, or another type of graphics processor), a digital signal processor, a crypto processor, a chipset, mass storage 1014 (such as hard disk, compact disk (CD), digital versatile disk (DVD) and so forth), input and/or output devices 1016, and so forth.

In various embodiments, system 1000 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

One or more of the transistors 100 described above may be included in the system 1000 of FIG. 10 as part of any one of a number of circuits. For example, the transistor 100 may be part of the CPU 1006, motherboard 1004, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:
   a substrate having a top surface and first and second stepped source/drain recesses;
   a first stepped source/drain region in the first stepped source/drain recess, wherein the first stepped source/drain region includes a first layer of a first semiconductor material and a second layer of the first semiconductor material;
   a second stepped source/drain region in the second stepped source/drain recess, wherein the second stepped source/drain region includes a third layer of the first semiconductor material and a fourth layer of the first semiconductor material;
   wherein each of the first and second stepped source/drain recesses includes a first step extending to a first depth beneath the top surface of the substrate and a second step extending to a second depth beneath the top surface of the substrate, the second depth being deeper than the first depth; and wherein a smallest distance between the first step of the first stepped source/drain recess and the first step of the second stepped source/drain recess is smaller than a smallest distance between the second step of the first stepped source/drain recess and the second step of the second stepped source/drain recess.

2. The device of claim 1, wherein the first semiconductor material has a first lattice spacing and wherein the substrate comprises a second semiconductor material with a second lattice spacing, the first and second lattice spacings being different to generate a strain in a channel in the substrate adjacent the top surface of the substrate and between the first and second stepped source/drain regions.

3. The device of claim 2, wherein the substrate comprises silicon and the first and second stepped source/drain regions comprise silicon germanium.

4. The device of claim 1, further comprising a channel in the substrate adjacent the top surface of the substrate and between the first and second stepped source/drain regions, and a gate on the substrate above the channel, the gate having a width, wherein the smallest distance between the first step of the first stepped source/drain recess and the first step of the second stepped source/drain recess is about equal to the width of the gate, or smaller.

5. The device of claim 4, wherein the smallest distance between the first step of the first stepped source/drain recess and the first step of the second stepped source/drain recess is between about the width of the gate and about one half of the width of the gate.

6. The device of claim 4, wherein the first depth is between about one fourth of the width of the gate and about three fourths of the width of the gate.

7. The device of claim 4, wherein the second depth is between about three times the first depth and about six times the first depth.

8. The device of claim 4, wherein the smallest distance between the second step of the first stepped source/drain recess and the second step of the second stepped source/drain recess is between about one and a half the width of the gate and about the width of the gate.

9. The device of claim 4, further comprising a first spacer layer on each side of the gate so that the gate is between the two first spacer layers and a second spacer layer on each first spacer layer so that each first spacer layer is between a second spacer layer and the gate.

10. A device, comprising:
a substrate;
a first stepped source/drain with a first step and a second step, wherein the first stepped source/drain includes a first layer of a first semiconductor material and a second layer of the first semiconductor material;
a second stepped source/drain with a first step and a second step, wherein the second stepped source/drain includes a third layer of the first semiconductor material and a fourth layer of the first semiconductor material; and
wherein there are a first width between the first steps of the first and second source/drains and a second width, different than the first width, between the second steps of the first and second source/drains.

11. The device of claim 10, wherein the first and second stepped source/drains are at least partially within first and second stepped recesses in the substrate.

12. The device of claim 10, wherein the first semiconductor material has a first lattice spacing and wherein the substrate comprises a second semiconductor material with a second lattice spacing, the first and second lattice spacings being different to generate a strain in a channel between the first and second source/drains.

13. The device of claim 12, further comprising a gate on a top surface of the substrate above the channel, the gate having a width, wherein the smallest distance between the first step of the first stepped source/drain and the first step of the second stepped source/drain is about equal to the width of the gate, or smaller.

14. The device of claim 13, wherein the first steps have a first depth that is equal to a distance between about one fourth of the width of the gate and about three fourths of the width of the gate.

15. The device of claim 14, wherein the second steps have a second depth that is equal to a distance between about three times the first depth and about six times the first depth.

16. The device of claim 13, wherein the top surface of the substrate is below top surfaces of the first and second source/drains.

17. The device of claim 13, further comprising a first spacer layer on each side of the gate so that the gate is between the two first spacer layers, and a second spacer layer on each first spacer layer so that each first spacer layer is between a second spacer layer and the gate.

18. The device of claim 10, wherein the first layer of the first semiconductor material is closer to the channel and the second layer of the first semiconductor material is further from the channel, and wherein the third layer of the first semiconductor material is closer to the channel and the fourth layer of the first semiconductor material is further from the channel.

19. The device of claim 10, wherein each of the first and second source/drains comprise two epitaxial layers of material.

20. The device of claim 10, wherein the substrate and first and second stepped source drains are part of a transistor that is part of a microprocessor attached to a motherboard, and further comprising a graphics processing unit integrated with the motherboard.

21. A method, comprising:
forming a gate on a substrate, the gate having first and second sides extending up from a top surface of a substrate;
forming a first set of spacers on the sides of the gate;
forming a second set of spacers on the first set of spacers;
forming a first set of recesses adjacent the sides of the gate, the first set of recesses having a first depth beneath the top surface of the substrate and being separated beneath the gate by a first distance;
removing the second set of spacers after forming the first set of recesses;
forming a second set of recesses adjacent the sides of the gate, the second set of recesses having a second depth beneath the top surface of the substrate and being separated beneath the gate by a second distance, the second depth being less deep than the first depth, the second distance being smaller than the first distance; and
forming first and second source/drain regions in the first and second sets of recesses.

22. The method of claim 21, wherein forming first and second source/drain regions comprising epitaxially growing the first and second source/drain regions.

23. The method of claim 21, wherein the substrate comprises a first semiconductor material with a first lattice spacing and the first and second stepped source/drain regions comprise a second semiconductor material with a second lattice spacing, the first and second lattice spacings being different to generate a strain in a channel between the first and second source/drains.

24. A method, comprising:

forming a gate on a substrate, the gate having first and second sides extending up from a top surface of a substrate;

forming a first set of spacers on the sides of the gate;

forming a first set of recesses adjacent the sides of the gate, the first set of recesses having a first depth beneath the top surface of the substrate and being separated beneath the gate by a first distance;

forming a second set of recesses adjacent the sides of the gate, the second set of recesses having a second depth beneath the top surface of the substrate and being separated beneath the gate by a second distance, the second depth being less deep than the first depth, the second distance being smaller than the first distance;

forming a first epitaxial source/drain layer in each recess of the second set of recesses prior to forming the first set of recesses;

forming a second set of spacers on the first set of spacers after forming the first epitaxial source/drain layers, wherein the first set of recesses are formed after forming the first and second sets of spacers; and forming a second epitaxial source/drain layer in each recess of the first set of recesses.

* * * * *